(12) United States Patent
Hsueh et al.

(10) Patent No.: US 7,782,656 B2
(45) Date of Patent: Aug. 24, 2010

(54) SRAM WITH IMPROVED READ/WRITE STABILITY

(75) Inventors: Fu-Lung Hsueh, Hsinchu (TW); Shine Chung, Taipei Hsien (TW); Wen-Kuan Fang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 149 days.

(21) Appl. No.: 12/178,420

(22) Filed: Jul. 23, 2008

(65) Prior Publication Data

US 2010/0020590 A1 Jan. 28, 2010

(51) Int. Cl.
*G11C 11/00* (2006.01)
*G11C 5/06* (2006.01)
*G11C 7/10* (2006.01)

(52) U.S. Cl. .............. 365/154; 365/63; 365/72; 365/191; 365/189.011

(58) Field of Classification Search .............. 365/154, 365/155, 156, 49.11, 63, 72
See application file for complete search history.

(56) References Cited

U.S. PATENT DOCUMENTS

| 6,191,990 | B1 * | 2/2001 | Itoh et al. | 365/208 |
| 7,035,135 | B2 * | 4/2006 | Nii | 365/154 |
| 7,161,868 | B2 * | 1/2007 | Morishima | 365/230.05 |
| 2008/0049484 | A1 * | 2/2008 | Sasaki | 365/72 |

* cited by examiner

*Primary Examiner*—Ly D Pham
(74) *Attorney, Agent, or Firm*—K&L Gates LLP (57) ABSTRACT

A static random access memory (SRAM) cell is disclosed which comprises a cross-couple inverter latch coupled between a positive supply voltage and ground, and having at least a first storage node, and a first and second switching device serially connected between the first storage node and a predetermined voltage source, wherein the first switching device is controlled by a word select signal, and the second switching device is controlled by a first bit select signal, wherein either the word select signal or the first bit select signal is only activated during a write operation.

15 Claims, 6 Drawing Sheets

SRAM WITH IMPROVED READ/WRITE STABILITY

BACKGROUND

The present invention relates generally to integrated circuit design, and, more particularly, to static random access memory (SRAM) with improved read/write stability.

Figure 1:
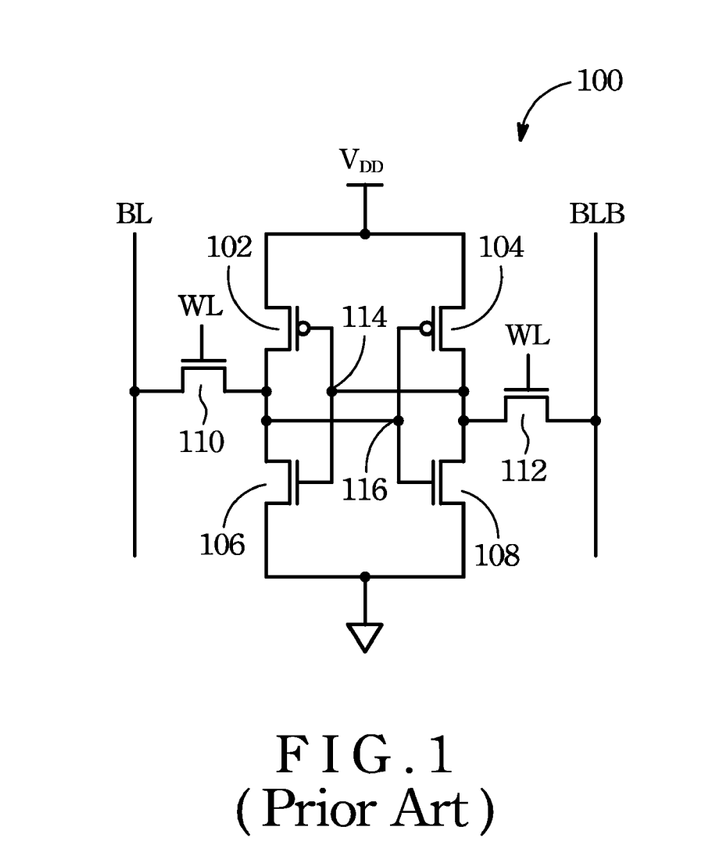
FIG. 1 schematically illustrates a conventional 6-T SRAM cell.

SRAM is a type of memory device that stores data in an array of cells that do not need to be constantly refreshed as long as it remains being supplied with power. FIG. 1 schematically illustrates a conventional 6-T SRAM cell 100 comprised of pull-up devices 102 and 104, pull-down devices 106 and 108, and pass gate devices 110 and 112. The pull-up device 102 is a PMOS transistor having a source coupled to a supply voltage VDD, and a drain coupled to a drain of the pull-down device 106, which is an NMOS device having its source coupled to ground or VSS, which can be any voltage lower than the supply voltage VDD. The pull-up device 104 is also a PMOS transistor having a source coupled to the supply voltage VDD, and a drain coupled to a drain of the pull-down device 108, which is an NMOS device having its source coupled to the source of the pull-down device 106, and to ground or VSS. The gates of the pull-up device 102 and the pull-down device 106 are coupled together with the drains of the pull-up device 104 and 108 at a node 114. Likewise, the gates of the pull-up device 104 and the pull-down device 108 are coupled together with the drains of the pull-up device 102 and the pull-down 106 at a node 116. The pass gate device 110 connects the node 116 to a bit line BL, whereas the pass gate device 112 connects the node 114 to a complementary bit line BLB.

The pull-up device 102 and the pull-down device 106 make up an inverter cross-coupled with another inverter comprised of the pull-device device 104 and the pull-down device 108. When the pass gate devices 110 and 112 are turned off, the nodes 114 and 116 latch a value and its complement therein. In read or write operation, the signal on the word line WL is asserted to turn on the pass gate device 110 and 112 to enable the nodes 114 and 116 to be access through the bit line BL and the complementary bit line BLB.

One drawback of the conventional SRAM cell 100 is that the data stored in the cell may be disturbed during read or write operation. In a physical SRAM chip, a plurality of cells is arranged in an array where a row of cells are connected by a single word line. In read/write operation, the signal on a word line is asserted to turn on the pass gate devices of a row of cells. Although only one cell on the selected row is desired for the read/write operation, the pass gate devices of other cells on the selected row are also turned on, thereby causing the data stored in those cells to be in direct connection with their corresponding bit lines and complementary bit lines. As a result, the data stored in those cells can be disturbed by the voltages on the bit lines and the complementary bit lines.

Figure 2:
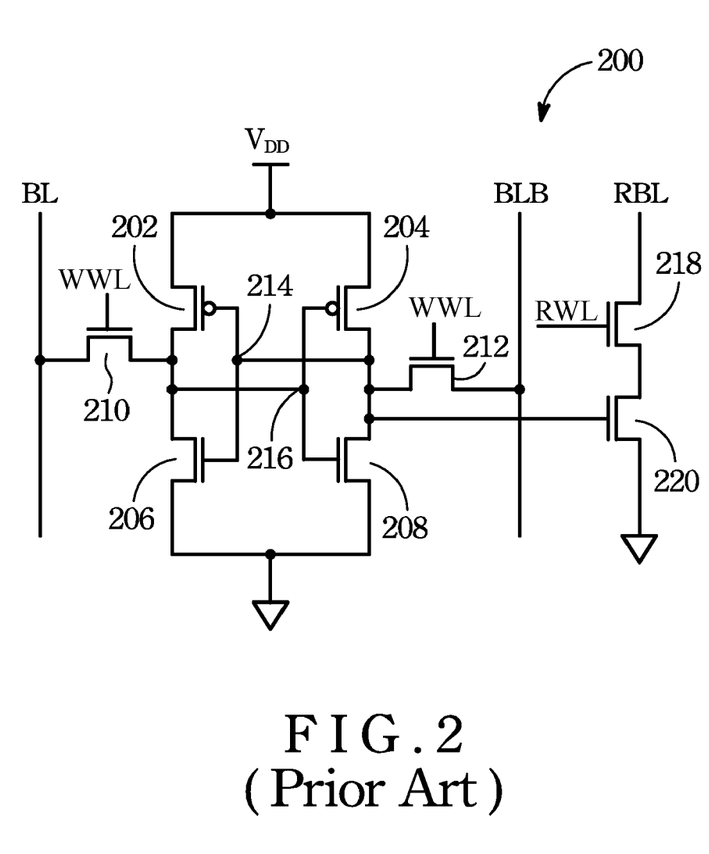
FIG. 2 schematically illustrates a conventional 8-T SRAM cell.

In order to address the read/write disturbance issue, an 8-T SRAM cell 200 has been proposed as shown in FIG. 2. The conventional 8-T SRAM cell 200 comprised of pull-up devices 202 and 204, pull-down devices 206 and 208, pass gate devices 210 and 212, a read select device 218, a read control device 220. The pull-up device 202 is a PMOS transistor having a source coupled to a supply voltage VDD, and a drain coupled to a drain of the pull-down device 206, which is an NMOS device having its source coupled to ground or VSS. The pull-up device 204 is also a PMOS transistor having a source coupled to the supply voltage VDD, and a drain coupled to a drain of the pull-down device 208, which is an NMOS device having its source coupled to the source of the pull-down device 206, and to ground or VSS. The gates of the pull-up device 202 and the pull-down device 206 are coupled together with the drains of the pull-up device 204 and the pull-down device 208 at a node 214. Likewise, the gates of the pull-up device 204 and the pull-down device 208 are coupled together with the drains of the pull-up device 202 and the pull-down device 206 at a node 216. The pass gate device 210 connects the node 216 to a bit line BL, whereas the pass gate device 212 connects the node 214 to a complementary bit line BLB.

The read select device 218 and the read control device 220 are serially connected along a read bit line RBL. The gate of the read select device 218 is controlled by the read word line RWL, whereas the gate of the read control device 220 is connected to the node 214 at the drains of the pull-up device 204 and the pull-down device 208.

In read operation, the signal on the RWL is asserted to turn on the read select device 218. The value at the node 214 determines whether or not the read control device 220 is turned on. For example, if the value at the node 214 is a logic "1," the read control device 220 is turned on, such that a signal can be read through the read bit line RBL, whereas if the value at the node 214 is a logic "0," the read control device 220 is turned off, such that a signal cannot be read through the read bit line RBL. Because the read bit line RBL is not directly connected to the node 214, the charges stored at node 214 are not disturbed during the read operation.

Although the SRAM cell 200 is proposed to address the read disturbance issue of the conventional 6-T cells, it does not eliminate the read disturbance completely for the whole cell array. In a physical SRAM chip, a plurality of cells are arranged in an array where a row of cells are connected by a single read word line and write word line, respectively. In a read operation, the signal on a read word line RWL is asserted to turn on the read select transistor 218, and the data stored in SRAM cells could be read out without any read disturbance. In a write operation, the gate of the write select transistors 210 and 212 are both connected to a write word line WWL. Although only one cell on the selected row is desired for the write operation, the pass gate devices of other not-to-be written cells on the selected row are also turned on and enter dummy read mode, thereby causing the data stored in those cells to be in direct connection with their corresponding bit lines and complementary bit lines. As a result, the data stored in those unselected cells can still be disturbed by the voltages on their corresponding bit lines and the complementary bit lines. Apparently, the aforementioned RWL and WWL may be merged into the same word line for a compact layout with compromised performance.

Thus, what is needed is an SRAM design that eliminates data disturbance during read/write operation.

SUMMARY

The present invention is directed to a SRAM cell. In one embodiment of the present invention, the SARM cell comprises: a cross-couple inverter latch coupled between a positive supply voltage and ground, and having at least a first storage node, and a first and second switching device serially connected between the first storage node and a predetermined voltage source, wherein the first switching device is controlled by a word select signal, and the second switching device is controlled by a first bit select signal, wherein either the word select signal or the first bit select signal is only activated during a write operation.

The construction and method of operation of the invention, however, together with additional objects and advantages thereof will be best understood from the following description of specific embodiments when read in connection with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DESCRIPTION

This invention describes SRAM with improved read/write stability. The following merely illustrates various embodiments of the present invention for purposes of explaining the principles thereof. It is understood that those skilled in the art will be able to devise various equivalents that, although not explicitly described herein, embody the principles of this invention.

Figure 3:
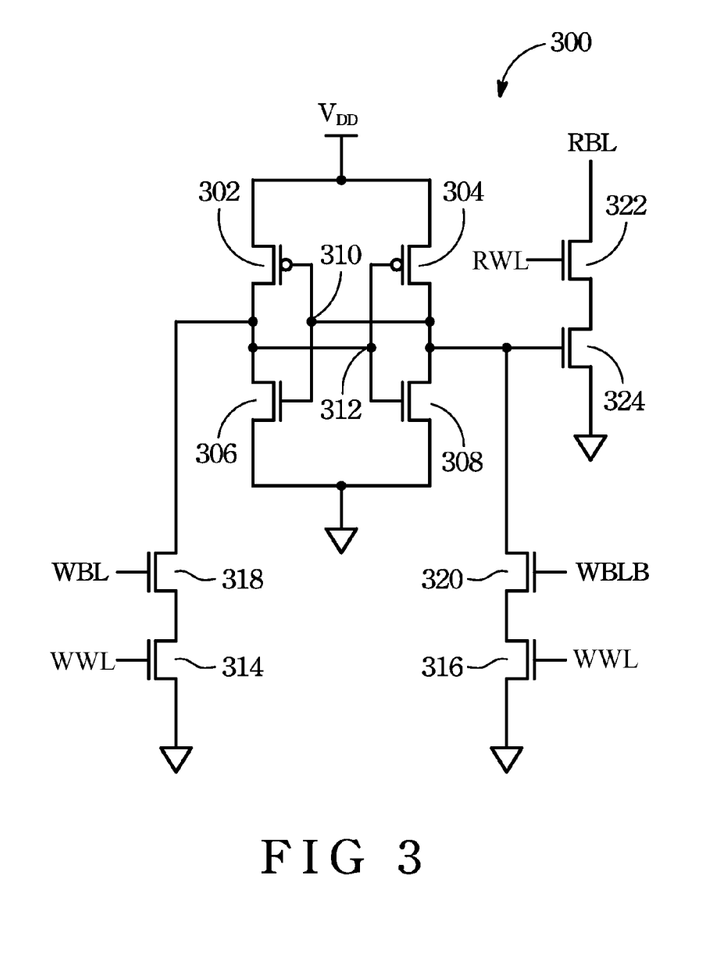
FIG. 3 schematically illustrates a 10-T SRAM cell in accordance with a first embodiment of the present invention.

FIG. 3 schematically illustrates a 10-T SRAM cell 300 in accordance with a first embodiment of the present invention. The 10-T SRAM cell 300 is comprised of pull-up devices 302 and 304, pull-down devices 306 and 308, row select devices 314 and 316, write control devices 318 and 320, a read select device 322, and a read control device 324. The pull-up device 302 is a PMOS transistor, and has a source coupled to the supply voltage VDD. The pull-down device 306 is an NMOS transistor having a drain coupled to the drain of the pull-up device 302, and a source coupled to ground or VSS. Likewise, the pull-up device 304 is a PMOS transistor, and has a source coupled to the supply voltage VDD. The pull-down device 308 is an NMOS transistor having a drain coupled to the drain of the pull-up device 304, and a source coupled to ground or VSS. The gates of the pull-up device 302 and the pull-down device 306 are connected together with the drains of the pull-up device 304 and the pull-down device 308 at a node 310. The gates of the pull-up device 304 and the pull-down device 308 are connected together with the drains of the pull-up device 302 and the pull-down device 306 at a node 312.

The read select device 322 and the read control device 324 are connected in series, where the gate of the read select device 322 is controlled by a read word line RWL, and the gate of the read control device 324 is connected to the node 310. The write control device 318 and the row select device 314 are serially coupled between the node 312 and ground or VSS. The write control device 320 and the row select device 316 are serially coupled between the node 310 and ground or VSS. The gates of the row select devices 314 and 316 are controlled by a write word line WWL. The gates of the write control devices 318 and 320 are controlled by a write bit line WBL and a complementary write bit line WBLB, respectively. Apparently, the RWL and WWL may be merged into a single word line. Another option is to run a single global word line and generate separated local read-word-line and write-word-line with a control signal. The placements of the write control device 318 and the row select device 314 are swappable. Similarly, the placements of the write control device 320 and the row select device 316 are also swappable.

In read operation, the signal on the read word line RWL is asserted to turn on the read select device 322. The voltages on the write bit line WBL and the complementary write bit line WBLB are set at a low level, such that the write control devices 318 and 320 are turned off to keep the charges stored at the nodes 310 and 312 latched. Depending on the value stored at the node 310, the read control device 324 is turned on or off, such that it can affect the signal on the read bit line RBL. In the read operation, because the data storage nodes 310 and 312 is not directly connected to the read bit line RBL, and the write control devices 318 and 320 are turned off, the data stored therein are not disturbed. This improves the stability of the read operation significantly.

In write operation, the signal on the write word line WWL is asserted to turn on the row select devices 314 and 316. The signal on the write bit line WBL or the complementary write bit line WBLB is also asserted to turn on the write control device 318 or 320, such that the node 310 or 312 is selectively pulled to ground depending on a desired value to be written into the cell 300.

The write bit lines WBL of neighboring cells with the same write word line WWL are controlled independently. This is the same for the complementary write bit lines WBLB of neighboring cells. Thus, when the signal on the write bit line WBL or the complementary write bit line WBLB of the cell 300 is asserted to turn on the write control device 318 or 320, those devices of the neighboring cells remained off, and therefore the data stored in the neighboring cells are not disturbed. This improves the stability of the write operation significantly.

Figure 4:
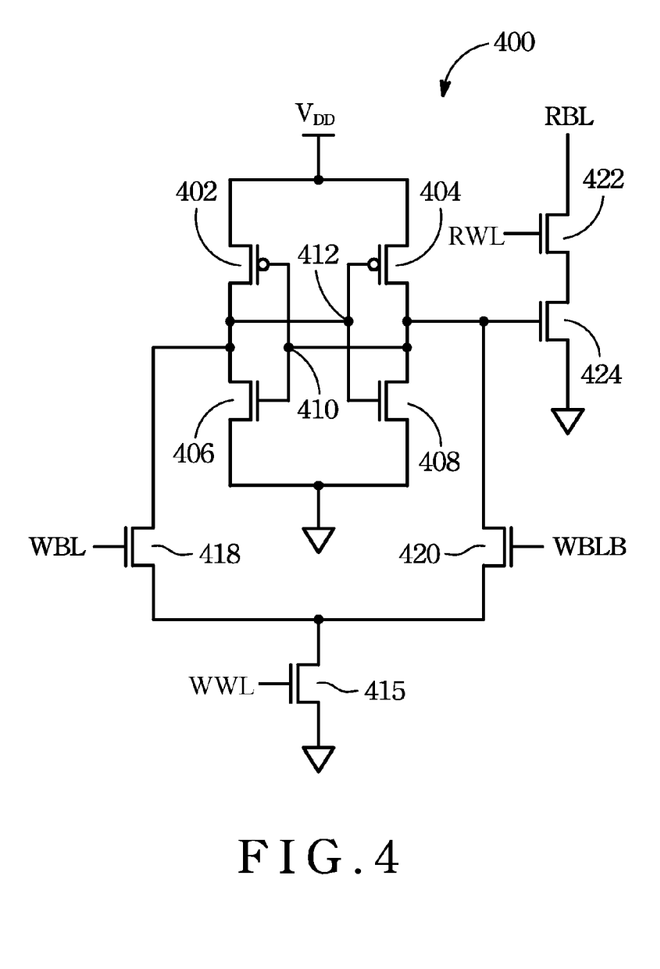
FIG. 4 schematically illustrates a 9-T SRAM cell in accordance with a second embodiment of the present invention.

FIG. 4 schematically illustrates a 9-T SRAM cell 400 in accordance with a second embodiment of the present invention. The 9-T SRAM cell 400 is comprised of pull-up devices 402 and 404, pull-down devices 406 and 408, a row select device 415, write control devices 418 and 420, a read select device 422, and a read control device 424. In essence, the devices 314 and 316 of FIG. 3 are shared and simplified into the device 415 of FIG. 4. The pull-up device 402 is a PMOS transistor, and has a source coupled to the supply voltage VDD. The pull-down device 406 is an NMOS transistor having a drain coupled to the drain of the pull-up device 402 and a source coupled to ground or VSS. Likewise, the pull-up device 404 is a PMOS transistor, and has a source coupled to the supply voltage VDD. The pull-down device 408 is an NMOS transistor having a drain coupled to the drain of the pull-up device 404 and a source coupled to ground or VSS. The gates of the pull-up device 402 and the pull-down device 406 are connected together with the drains of the pull-up device 404 and the pull-down device 408 at a node 410. The gates of the pull-up device 404 and the pull-down device 408 are connected together with the drains of the pull-up device 402 and the pull-down device 406 at a node 412.

The write control device 418 has a drain coupled to the node 412 and a source coupled to the drain of the row select device 415. The write control device 420 has a drain coupled to the node 410 and a source coupled to the drain of the row select device 415. The gates of the write control devices 418 and 420 are controlled by a write bit line WBL and a complementary write bit line WBLB, respectively. The row select device 415 has a source coupled to ground or VSS, and a gate controlled by a write word line WWL.

In read operation, a read word line RWL is asserted to turn on the read select device 422. The voltages on the write bit line WBL and the complementary write bit line WBLB, as well as the write word line WWL are set at a low level, such that the write control devices 418 and 420 as well as the row select device 415 are turned off to keep the charges stored at the nodes 410 and 412 latched. Depending on the value stored at the node 410, the read control device 424 is turned on or off, such that it can affect the signal on the read bit line RBL. In the read operation, because the data storage nodes 410 and 412 are not directly connected to the read bit line RBL, and the write control devices 418 and 420 are turned off, the data stored therein are not disturbed. This improves the stability of the read operation significantly.

In write operation, the write word line WWL is asserted to turn on the row select device 415. The gate of the read select device 422 is controlled by the read word line RWL, which is not asserted. The signal on the write bit line WBL or the complementary write bit line WBLB is also asserted to turn on the write control device 418 or 420, such that the node 410 or 412 is selectively pulled to ground depending on a desired value to be written into the cell 400.

The write bit lines WBL of neighboring cells are controlled independently. This is the same for the complementary write bit lines WBLB of neighboring cells. Thus, when the signal on the write bit line WBL or the complementary write bit line WBLB of the cell 400 is asserted to turn on the write control device 418 or 420, those devices of the neighboring cells remained off, and therefore the data stored in the neighboring cells are not disturbed. This improves the stability of the write operation significantly.

Figure 5:
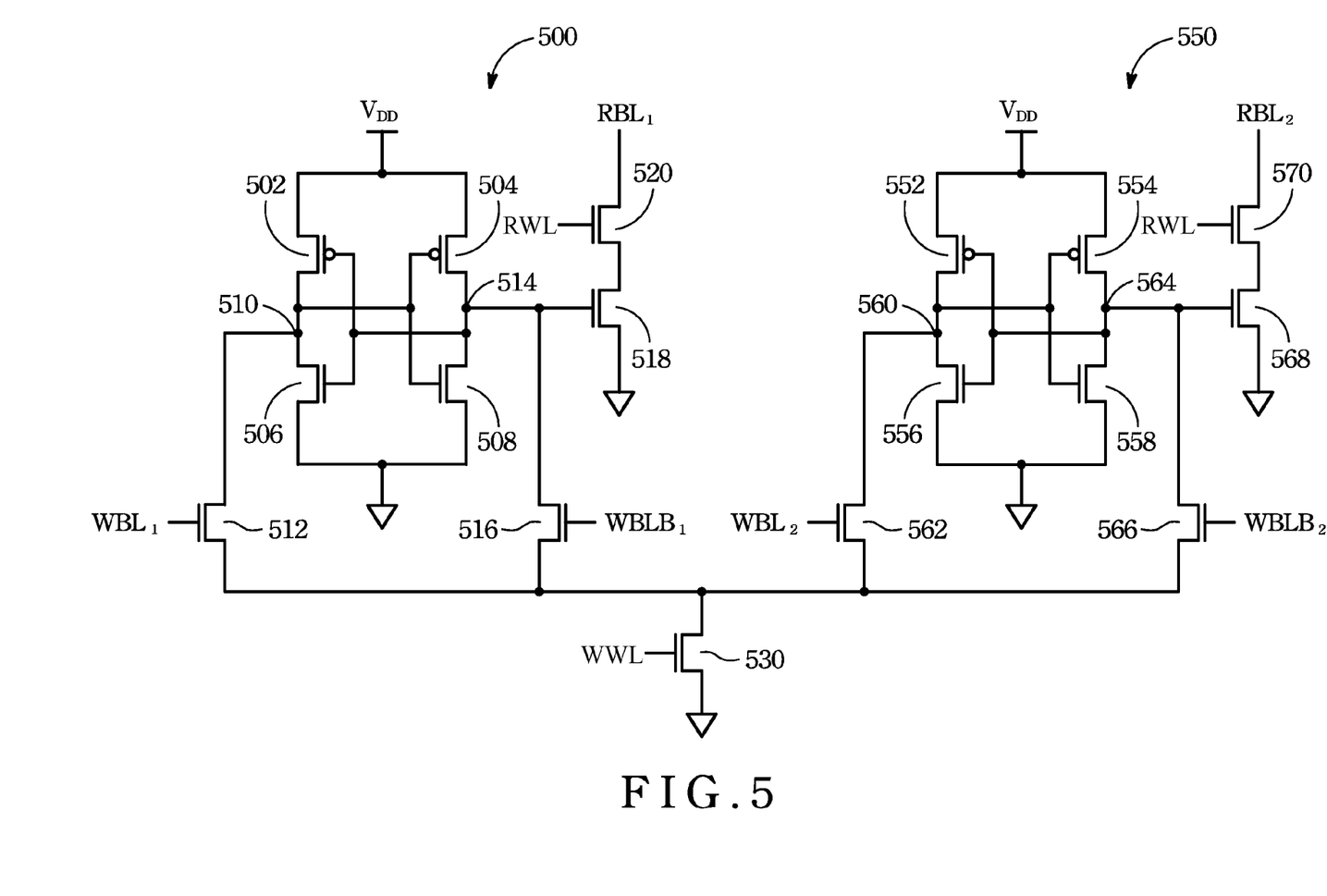
FIG. 5 schematically illustrates a pair of 8.5-T SRAM cells in accordance with a third embodiment of the present invention.

FIG. 5 schematically illustrates a pair of 8.5-T SRAM cells 500 and 550 in accordance with a third embodiment of the present invention. In essence, the device 415 of FIG. 4 is shared by neighbor SRAM cell with same WWL and becomes a device 530 for two SRAM cells 500 and 550 of FIG. 5. Specifically, the SRAM cell 500 includes pull-up devices 502 and 504, and pull-down devices 506 and 508 cross-coupled between the supply voltage VDD and ground or VSS. A node 510 at the drains of the pull-up device 502 and the pull-down device 506 is coupled to a drain of a write control device 512, whose gate is controlled by a write bit line WBL1. A node 514 at the drains of the pull-up device 504 and the pull-down device 508 is coupled to a drain of a write control device 516, whose gate is controlled by a complementary write bit line WBLB1. The node 514 is also coupled to a gate of a read control device 518 coupled between a read select device 520 and ground or VSS on a row bit line RBL1. The gate of the read select device 520 is controlled by a read word line RWL.

The SRAM cell 550 includes pull-up devices 552 and 554, and pull-down devices 556 and 558 cross-coupled between the supply voltage VDD and ground or VSS. A node 560 at the drains of the pull-up device 552 and the pull-down device 556 is coupled to a drain of a write control device 562, whose gate is controlled by a write bit line WBL2. A node 564 at the drains of the pull-up device 554 and the pull-down device 558 is coupled to a drain of a write control device 566, whose gate is controlled by a complementary write bit line WBLB2. The node 564 is also coupled to a gate of a read control device 568 coupled between a read select device 570 and ground or VSS on a row bit line RBL2. The gate of the read select device 570 is controlled by the read word line RWL. The sources of write control devices 512, 516, 562, and 566 are coupled to a row select device 530, whose gate is controlled by a write word line WWL, and source is coupled to ground or VSS.

The write bit lines WBL1/WBLB1 and WBL2/WBLB2 are separately controlled in the write operation, such the SRAM cells 500 and 550 can be independently accessed without disturbing the data stored therein. For example, if the SRAM cell 500 is selected for write operation, the write word line WWL is asserted to turn on the row select device 530. The signal on the write bit line WBL1 or the complementary write bit line WBLB1 of the cell 500 is asserted, while the signals on both the write bit line WBL2 and the complementary write bit line WBLB2 of the cell 550 are not asserted or WWL is disasserted. As a result, the SRAM cell 500 can be accessed for write operation, without disturbing the data stored in its neighboring cell 550.

In read operation, the read word line RWL is asserted to turn on the read select device 520 and 570, while the signals on the write bit lines WBL1 and WBL2 and the complementary write bit lines WBLB1 and WBLB2 are not asserted to keep the write control devices 512, 516, 562 and 566 off or WWL is disasserted. The data stored in the SRAM cells 500 and 550 can be read through the read bit lines RBL1 and RBL2, respectively.

Figure 6:
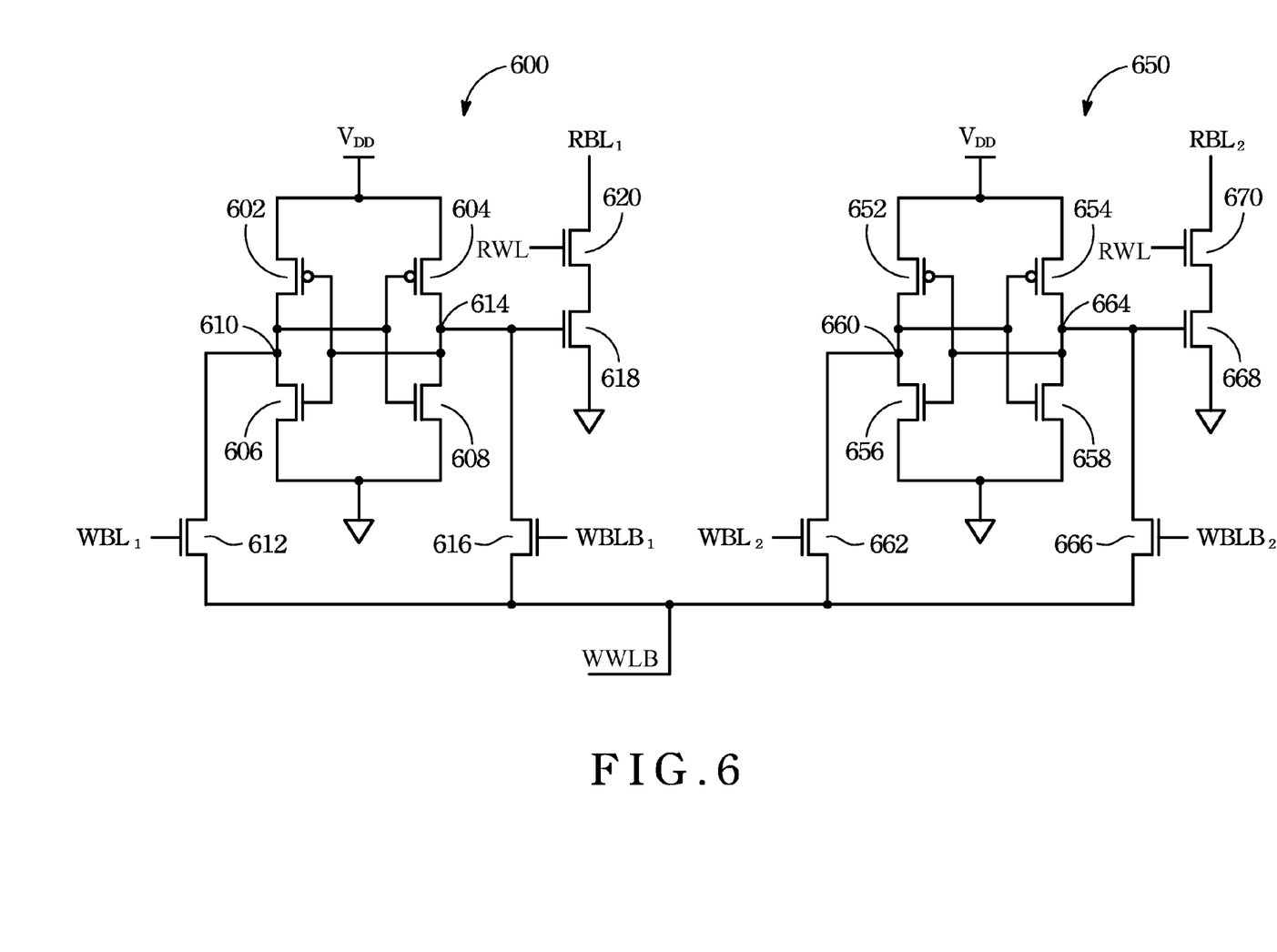
FIG. 6 schematically illustrates a pair of 8-T SRAM cells in accordance with a fourth embodiment of the present invention.

FIG. 6 schematically illustrates a pair of 8-T SRAM cells 600 and 650 in accordance with a fourth embodiment of the present invention. The SRAM cell 600 includes pull-up devices 602 and 604, and pull-down devices 606 and 608 cross-coupled between the supply voltage VDD and ground or VSS. A node 610 at the drains of the pull-up device 602 and the pull-down device 606 is coupled to a drain of a write control device 612, whose gate is controlled by a write bit line WBL1. A node 614 at the drains of the pull-up device 604 and the pull-down device 608 is coupled to a drain of a write control device 616, whose gate is controlled by a complementary write bit line WBLB1. The node 614 is also coupled to a gate of a read control device 618 coupled between a read select device 620 and ground or VSS on a row bit line RBL1. The gate of the read select device 620 is controlled by a read word line RWL.

The SRAM cell 650 includes pull-up devices 652 and 654, and pull-down devices 656 and 658 cross-coupled between the supply voltage VDD and ground or VSS. A node 660 at the drains of the pull-up device 652 and the pull-down device 656 is coupled to a drain of a write control device 662, whose gate is controlled by a write bit line WBL2. A node 664 at the drains of the pull-up device 654 and the pull-down device 658 is coupled to a drain of a write control device 666, whose gate is controlled by a complementary write bit line WBLB2. The node 664 is also coupled to a gate of a read control device 668 coupled between a read select device 670 and ground or VSS on a row bit line RBL2. The gate of the read select device 670 is controlled by the read word line RWL. The sources of write control devices 612, 616, 662, and 666 are coupled to a write word line bar signal (WWLB) which is asserted to low voltage during a write operation.

The write bit lines WBL1/WBLB1 and the write bit lines WBL2/WBLB2 are separately controlled, such that the SRAM cells 600 and 650 can be separately accessed for write operation without disturbing the data stored in the neighboring cell.

Figure 7:
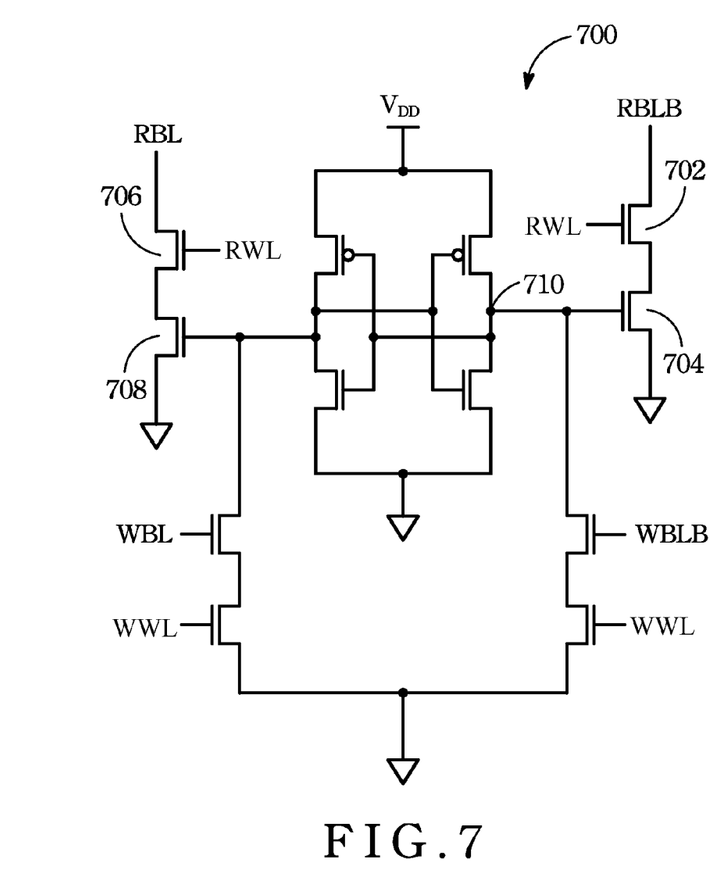
FIG. 7 schematically illustrates a 12-T SRAM cell in accordance with a fifth embodiment of the present invention.

FIG. 7 schematically illustrates a 12-T SRAM cell 700 in accordance with a fifth embodiment of the present invention. The SRAM cell 300 of FIG. 3 uses single end sensing with RBL only and without RBLB. But some applications need differential sending. Therefore, the basic SRAM cell 300 is modified into the SRAM cell 700 shown in FIG. 7. The configuration of the SRAM cell 700 is similar to that of the 10-T SRAM cell 300 shown in FIG. 3 with the exception that the cell 700 includes two more transistors a read select device 702 and a read control device 704 serially connected on a complementary read bit line RBLB, in addition to a read select device 706 and a read control device 708 serially connected on a read bit line RBL. The gate of the read select devices 702 and 706 are controlled by a read word line RWL, which may either merge with the write word line WWL or remain separate from the WWL. The gate of the read control device 704 is connected to a data storage node 710 of the cell 700. Similarly, the gate of the read control device 708 is connected to another data storage node of the cell 700.

Similarly, SRAM cell 400 of FIG. 4 uses single end sensing with RBL only and without RBLB, but some applications need differential sending. Therefore, new embodiment with two extra transistors to generate RBLB as well for differential sensing as shown in FIG. 8.

Figure 8:
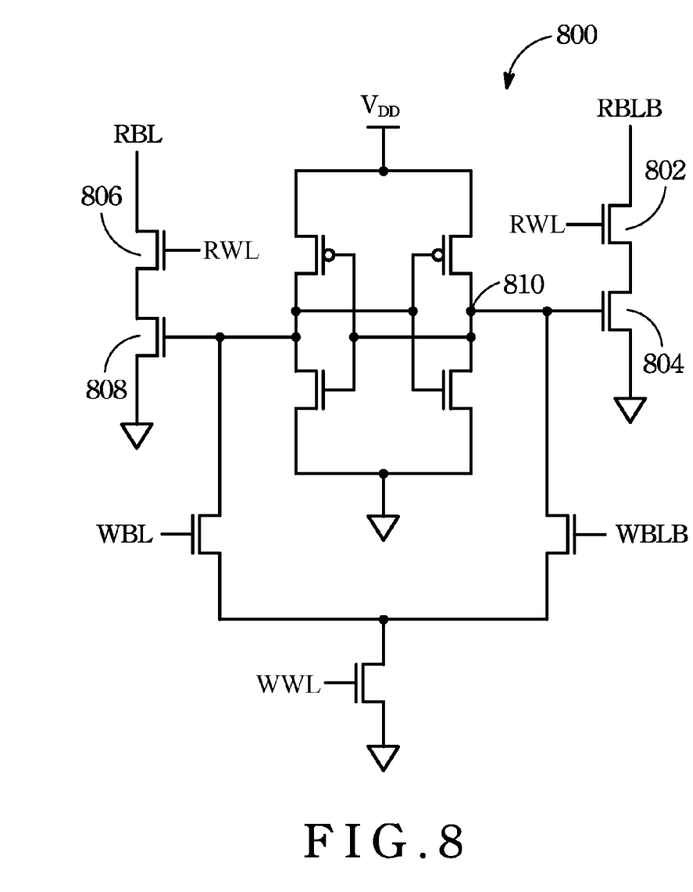
FIG. 8 schematically illustrates an 11-T SRAM cell in accordance with a sixth embodiment of the present invention.

FIG. 8 schematically illustrates an 11-T SRAM cell 800 in accordance with a sixth embodiment of the present invention. The configuration of the SRAM cell 800 is similar to that of the 9-T SRAM cell 400 shown in FIG. 4 with the exception that the cell 800 includes two more transistors a read select device 802 and a read control device 804 serially connected on a complementary read bit line RBLB, in addition to a read select device 806 and a read control device 808 serially connected on a read bit line RBL. The gate of the read select devices 802 and 806 are controlled by a read word line RWL. The gate of the read control device 804 is connected to a data storage node 810 of the cell 800. Apparently, the read word line RWL and write word line WWL may be merged into a single word line.

Figure 9:
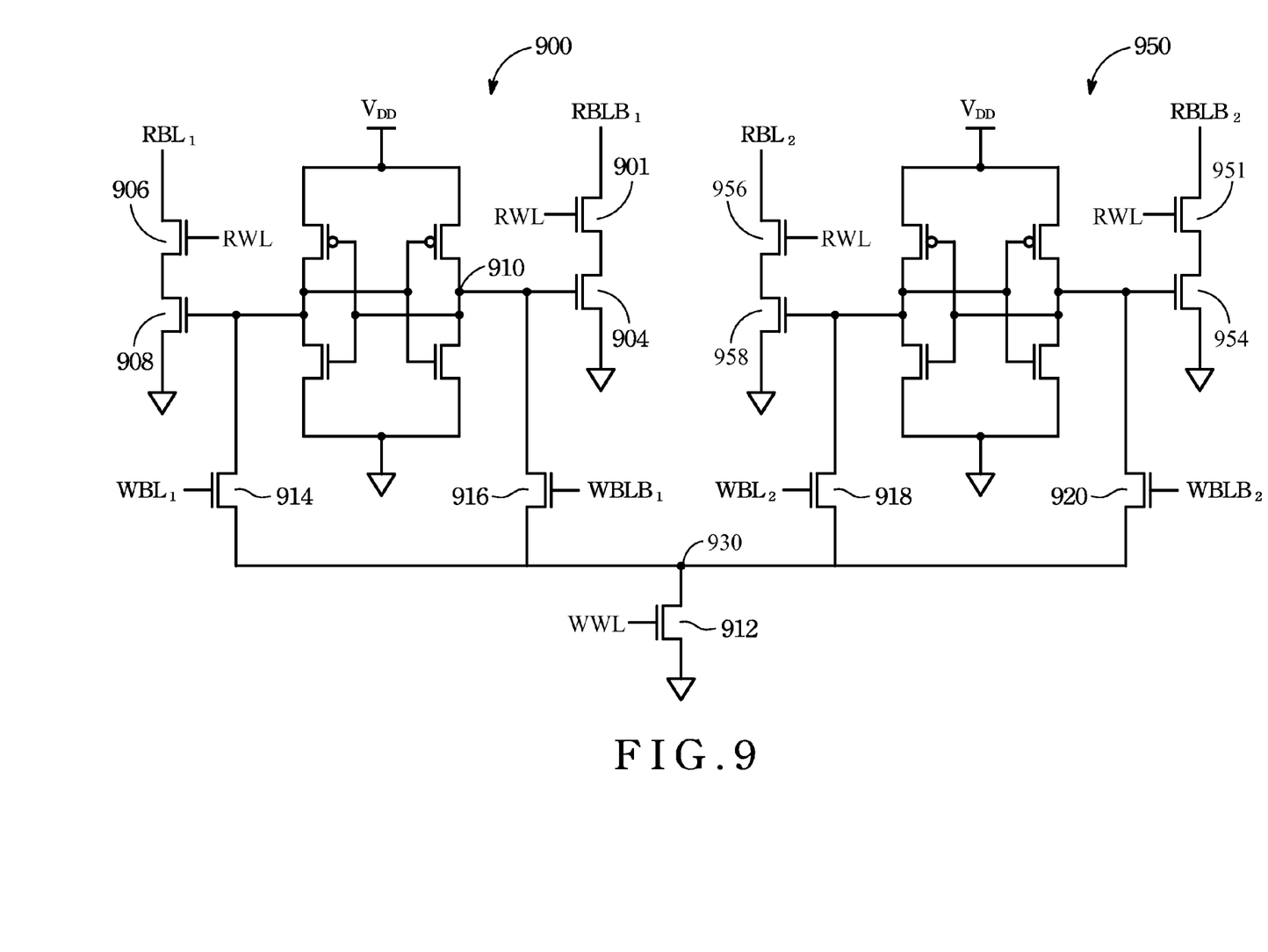
FIG. 9 schematically illustrates a pair of 10.5-T SRAM cells in accordance with a seventh embodiment of the present invention.

FIG. 9 schematically illustrates a pair of 10.5-T SRAM cells 900 and 950 in accordance with a seventh embodiment of the present invention. The configuration of the SRAM cell 900 (or 950) is similar to that of the 8.5-T SRAM cell 500 (or 550) shown in FIG. 5 with the exception that the cell 900 includes two more transistors a read select device 901 and a read control device 904 serially connected on a complementary read bit line RBLB, in addition to a read select device 906 and a read control device 908 serially connected on a read bit line RBL. The gate of the read select devices 901 is controlled by a read word line RWL, whereas the gate of the read control device 904 is connected to a data storage node 910 of the cell 900. The SRAM cell 950 has an identical structure as the SRAM cell 900, and requires no further descriptions.

It is noted that, as an alternative, the row select device 912 can be simplified such that the sources of the write control devices 914, 916, 918 and 920 and all write control devices in the same write word line are connected to a drain of row select device 912 at a node 930. In such case, the SRAM cells 900 and 950 become a 10-T configuration. Further more, the row select device 912 may be eliminated altogether by connecting a write word line bar signal (WWLB), which is asserted to low voltage during a write operation, directly to the node 930.

In above-described embodiments of the present invention, the read select devices are designed to be controlled by the read word line RWL. It is noted that, the read select devices can be controlled by lines other than the write word line WWL, such that the read select devices 901, 906, 951, 956 and the row select device 912 can be controlled separately.

Although the write paths for the SRAM cells depicted throughout FIGS. 3~9 are from the storage nodes to the VSS through the write select and the write control NMOS transistors, one skilled in the art would appreciate that the write path can also be formed from the storage nodes to the VCC through a write select and a write control PMOS transistor connected in series.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) cell comprising:
    a latch coupled between a positive supply voltage and ground, and having at least a first storage node; and
    a first switching device and a second switching device serially connected between the first storage node and a predetermined voltage source,
    wherein the first switching device is controlled by a word select signal and is shared by two or more SRAM cells, and the second switching device is controlled by a first bit select signal, wherein both the word select signal and the first bit select signal are activated during a write operation.

2. The SRAM cell of claim 1, wherein the latch comprises two cross-coupled inverters with the first storage node connected to both an output of one of the cross-coupled inverters and an input of the other one of the cross-coupled inverters.

3. The SRAM cell of claim 1, wherein the predetermined voltage source is the ground and both the first and second switching devices are NMOS transistors.

4. The SRAM cell of claim 1 further comprising:
    a second storage node on the latch always having complimentary voltage to the first storage node in a static state;
    a third and fourth switching device serially connected between the second storage node and the predetermined voltage source,
    wherein the third switching device is controlled by the word select signal, and the fourth switching device is controlled by a second bit select signal, wherein the first and second bit select signals have complimentary voltage to each other during an activation.

5. The SRAM cell of claim 4 further comprising:
    a third storage node on the latch always having complimentary voltage to the first storage node in a static state;
    a fifth switching device connected between the third storage node and the first third switching device,
    wherein the fifth switching device is controlled by a third bit select signal, wherein the first and third bit select signals have complimentary voltage to each other during an activation.

6. The SRAM cell of claim 1 further comprising a first and second NMOS transistor serially connected between the ground and a bit line, wherein a gate of the first NMOS transistor is connected to the first storage node and a gate of the second NMOS transistor is connected to a read word line, wherein the read word line is only activated during a read operation.

7. The SRAM cell of claim 6, wherein the word select signal and the read word line are the same and the first bit select signal is only activated during a write operation.

8. The SRAM cell of claim 6, wherein the word select signal and the read word line are separate signal lines yet controlled by a write word-line and a read word-line.

9. A static random access memory (SRAM) cell comprising:
   two cross-coupled inverters coupled between a positive supply voltage and ground and having a first storage node connected to both an output of one of the cross-coupled inverters and an input of the other one of the cross-coupled inverters; and
   a first switching device and a second switching device serially connected between the first storage node and a predetermined voltage source,
   wherein the first switching device is controlled by a word select signal and is shared by two or more SRAM cells, and the second switching device is controlled by a first bit select signal, wherein both the word select signal and the first bit select signal are activated during a write operation.

10. The SRAM cell of claim 9, wherein the predetermined voltage source is the ground and both the first and second switching devices are NMOS transistors.

11. The SRAM cell of claim 9 further comprising:
    a second storage node on the two cross-coupled inverters always having complimentary voltage to the first storage node in a static state;
    a third and fourth switching device serially connected between the second storage node and the predetermined voltage source,
    wherein the third switching device is controlled by the word select signal, and the fourth switching device is controlled by a second bit select signal, wherein the first and second bit select signals have complimentary voltage to each other during an activation.

12. The SRAM cell of claim 11 further comprising:
    a third storage node on the two cross-coupled inverters always having complimentary voltage to the first storage node in a static state;
    a fifth switching device connected between the third storage node and the third switching device,
    wherein the fifth switching device is controlled by a third bit select signal, wherein the first and third bit select signals have complimentary voltage to each other during an activation.

13. The SRAM cell of claim 9 further comprising a first and second NMOS transistor serially connected between the ground and a bit line, wherein a gate of the first NMOS transistor is connected to the first storage node and a gate of the second NMOS transistor is connected to a read word line, wherein the read word line is only activated during a read operation.

14. The SRAM cell of claim 13, wherein the word select signal and the read word line are the same and the first bit select signal is only activated during a write operation.

15. The SRAM cell of claim 13, wherein the word select signal and the read word line are separate signal lines yet controlled by a write word-line and a read word-line.

* * * * *